United States Patent
Mimino

(10) Patent No.: US 9,261,543 B2
(45) Date of Patent: Feb. 16, 2016

(54) POWER DETECTION DEVICE AND METHOD OF DRIVING THE SAME

(75) Inventor: Yutaka Mimino, Kyoto (JP)

(73) Assignee: ROHM CO., LTD. (JP)

(*) Notice: Subject to any disclaimer, the term of this patent is extended or adjusted under 35 U.S.C. 154(b) by 1050 days.

(21) Appl. No.: 13/365,612

(22) Filed: Feb. 3, 2012

(65) Prior Publication Data

US 2012/0202441 A1    Aug. 9, 2012

(30) Foreign Application Priority Data

Feb. 3, 2011 (JP) .................................. 2011-21416

(51) Int. Cl.
*H04B 17/00* (2015.01)
*G01R 21/10* (2006.01)
*H04B 1/04* (2006.01)

(52) U.S. Cl.
CPC ........ *G01R 21/10* (2013.01); *H04B 2001/0416* (2013.01)

(58) Field of Classification Search
USPC ...................................................... 455/115.1
See application file for complete search history.

(56) References Cited

U.S. PATENT DOCUMENTS

| 2008/0125061 A1* | 5/2008 | Kuriyama et al. | 455/127.1 |
| 2010/0013571 A1* | 1/2010 | Arell et al. | 333/103 |
| 2011/0279192 A1* | 11/2011 | Nash et al. | 333/105 |

FOREIGN PATENT DOCUMENTS

| JP | 05-022061 A | 1/1993 |
| JP | 09-186526 A | 7/1997 |

* cited by examiner

*Primary Examiner* — Yuwen Pan
*Assistant Examiner* — Fatuma Sherif
(74) *Attorney, Agent, or Firm* — Cantor Colburn LLP

(57) ABSTRACT

A power detection device includes first and second power detection circuits configured to output a first and second detection signals, respectively, each including a half-wave rectifier circuit having a transistor, and connected to an RF input terminal, a ripple filter having a transistor and a capacitor, and configured to filter ripples of a rectified signal from the half-wave rectifier circuit, a transmission circuit having a pair of transistors, and connected to the half-wave rectifier circuit and the ripple filter to transfer the rectified signal to the ripple filter, and a constant current source having a transistor to supply a current to the half-wave rectifier circuit, the ripple filter, and the transmission circuit, and a subtraction circuit configured to receive the first and second detection signals and to calculate a difference between the two signals.

11 Claims, 6 Drawing Sheets

POWER DETECTION DEVICE AND METHOD OF DRIVING THE SAME

CROSS-REFERENCE TO RELATED APPLICATION

This application is based upon and claims the benefit of priority from Japan Patent Application No. 2011-21416, filed on Feb. 3, 2011, the entire contents of which are incorporated herein by reference.

TECHNICAL FIELD

The present disclosure relates to a power detection device and a method of driving the power device, which is used for wireless devices, detects transmission power, and control an output voltage.

BACKGROUND

A wireless device is required to maintain a good communication quality, and power of its output signal should be controlled such that it does not interfere with another wireless device. In particular, a mobile wireless device is required to control power with a high precision in comparison to a fixed wireless device because a distance between mobile devices and their antenna orientations thereof are frequently changed.

Due to temperature characteristics of a semiconductor used in a power detector, the amplitude of an output signal is changed according to ambient temperature, regardless of the input power level. Therefore, there is a need to regulate the change in the output signal due to a change in temperature.

Thus, in one example of the related art, temperature compensation is performed by supplying a bias to a detection diode through a Zener diode having a positive temperature coefficient.

Further, in another example, temperature compensation is executed by configuring a balanced type circuit by using a diode and positive and negative power sources with the same capacity.

However, in the above examples, circuit components in the wireless device should be selected in such a manner that a temperature coefficient of a Zener diode and that of a detection diode are mutually canceled out. However, the Zener diode and the detection diode have different structures manufactured in different processes, and thus, it is often difficult to manufacture those components with characteristics sufficient to mutually cancel out the temperature coefficients of the Zener diode and the detection diode. This makes it difficult to produce a circuit with an appropriate combination of the above mentioned components, which leads to a degradation of a production yield. Further, this causes the power consumption to increase because of the amount of a current flowing through the Zener diode.

In addition, as the positive and negative power sources are required to have the same capacity, a production of the detection device becomes more complex and the related cost becomes more expensive. A power detection technology is widely used in wireless devices such as mobile phones, toys, etc., and thus the cost reduction also becomes an important issue in this technology. Moreover, the conventional technology imposes another problem that a change in the power source voltage leads to a change in a detected power output.

SUMMARY

The present disclosure provides some embodiments of a power detection device capable of executing temperature compensation of high precision without adding a particular component or using positive and negative power sources, and a method of driving the same.

According to one embodiment of the present disclosure, a power detection device includes first and second power detection circuits configured to output a first and second detection signals, respectively, each of the first and second power detection circuits including a half-wave rectifier circuit having a transistor, and connected to an RF input terminal, a ripple filter having a transistor and a capacitor, and configured to filter ripples of a rectified signal from the half-wave rectifier circuit, a transmission circuit having a pair of transistors, and connected to the half-wave rectifier circuit and the ripple filter to transfer the rectified signal to the ripple filter, and a constant current source having a transistor to supply a current to the half-wave rectifier circuit, the ripple filter, and the transmission circuit, wherein an RF signal is input to the RF input terminal of the first power detection circuit, and the RF input terminal of the second power detection circuit is grounded, and a subtraction circuit configured to receive the first and second detection signals and to calculate a difference between the first detection signal of the first power detection circuit and the second detection signal of the second power detection circuit.

According to another embodiment of the present disclosure, a method of driving a power detection device includes receiving, by an RF input terminal of a first power detection circuit, an input signal, wherein an RF input terminal of the second power detection circuit is grounded, determining a first detection output signal from the first power detection circuit and a second detection output signal from a second power detection circuit, and calculating, via a subtraction circuit, a difference between the determined first and second output signals.

DETAILED DESCRIPTION

Figure 1:
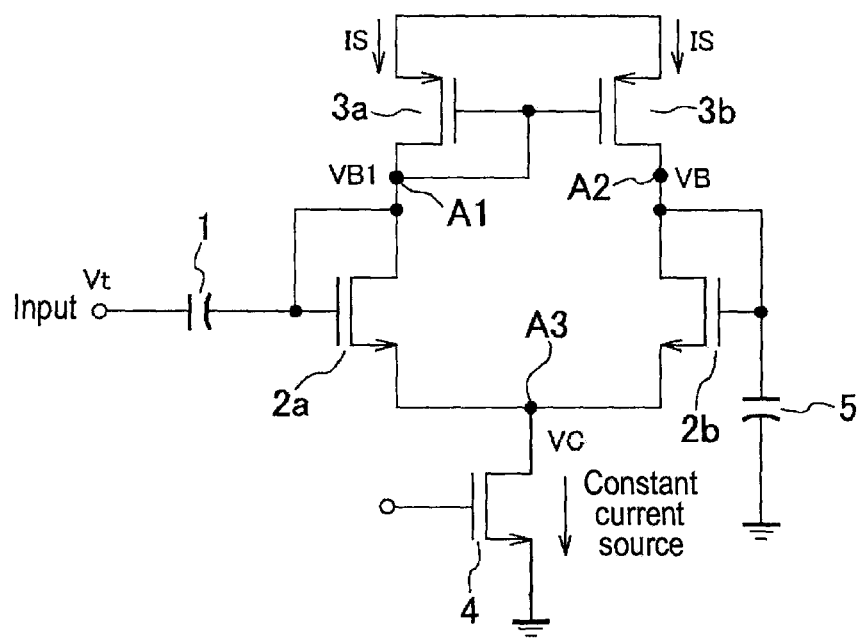
FIG. 1 is a circuitry illustrating a basic circuit configuration of a power detection device according to an embodiment of the present disclosure.

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments. In a following description of drawings, the same or like reference numerals are used for the same or like parts.

Drawings regarding structures are schematic and parts having mutually different dimension relations and rates are included in drawings.

First, a power detection circuit may be configured as shown in FIG. 1. FIG. 1 is a circuit diagram illustrating a basic circuit configuration of a power detection circuit in a power detection device according to an embodiment of the present disclosure. When an input RF signal passes through a capacitor 1, a DC component thereof is canceled. Thereafter, the DC component-canceled RF signal Vt is input to a gate of a N type MOS FET 2a. Here, a gate and a drain of the FET 2a are short-circuited, and a size and a current value of the FET 2a are set to supply a bias in the vicinity of a threshold voltage value.

If a negative signal is input to the gate of the FET 2a, a current is prevented to flow to the drain of the FET 2a, so that the RF signal Vt is rectified as a half-wave by the FET 2a. Here, a half-wave rectifier circuit comprises of the FET 2a. A half-wave rectified signal VB1 at A1 appears as a current signal in an N type MOS FET 2b through a pair of P type MOS FETs 3a and 3b. A drain of the P type MOS FET 3a and that of the P type MOS FET 3b are connected, and a gate of the FET 3a and that of the FET 3b are also connected. The gates of the FET 3a and FET 3b are connected to the drain of the FET 2a.

In FIG. 1, because of a constant current source provided by a FET 4, a size of a current IS flowing to a source of the FET 3a and to the FET 3b are the same. Here, the half-wave rectified signal VB1 is transmitted from the FET 3a to the FET 3b, and a transmission circuit is configured with the FET 3a and the FET 3b.

Since the gate and the drain of the FET 2b are short-circuited, and the gate and the drain of the FET 2b are grounded through a capacitor 5, an RF component of the half-wave rectified signal VB1 transmitted by the transmission circuit is canceled by the capacitor 5. Here, a ripple filter comprises of the FET 2b and the capacitor 5. At a point A2, a DC voltage VB is generated where the RF component is already canceled.

Thus, at a point A3, an output signal VC is generated where the RF signal input to the FET 2a and the DC voltage VB generated by the FET 2b overlap. With this configuration, since the N type MOS FET 4 corresponds to the constant current source, a stable voltage is drawn from A3. By detecting the voltage VC, a power detection can be executed.

Figure 2:
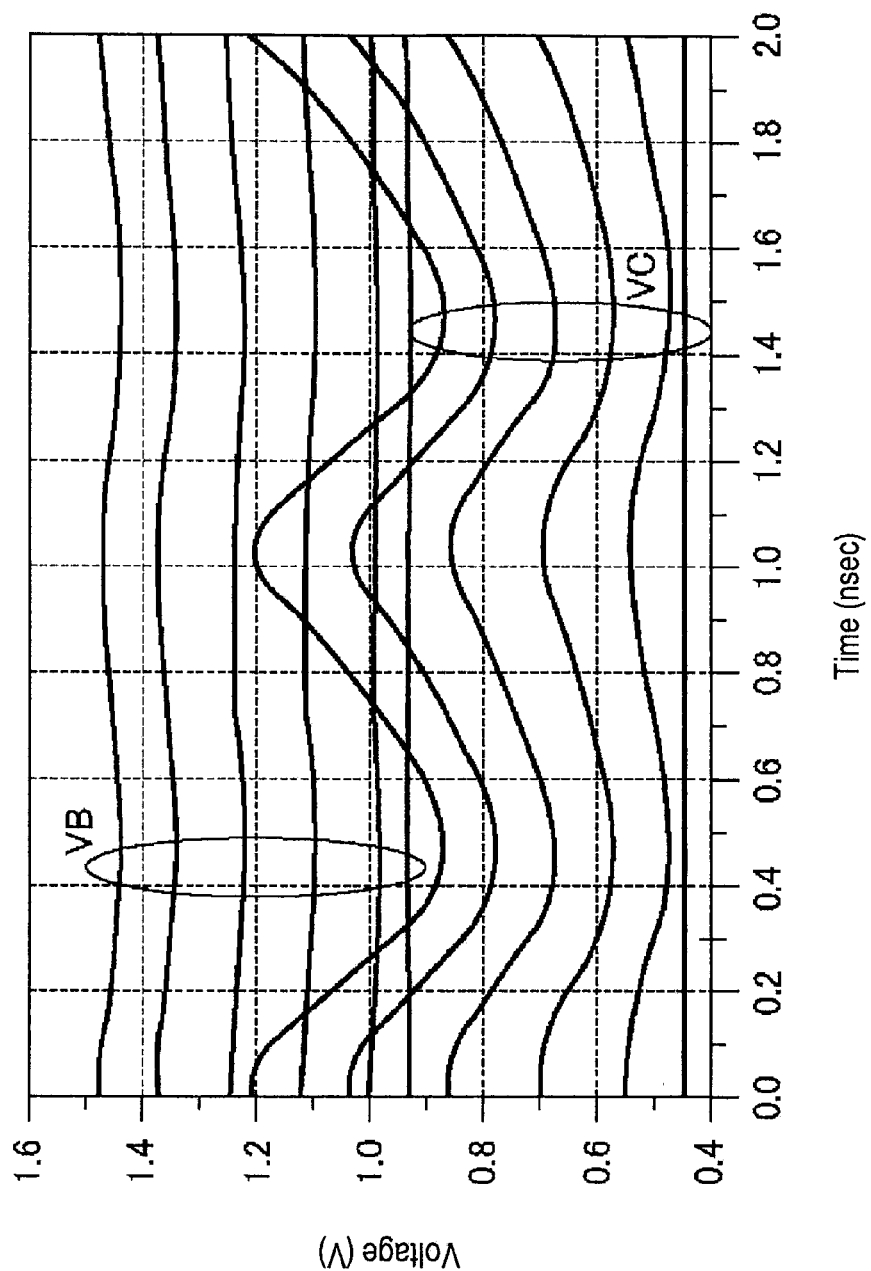
FIG. 2 is a graph illustrating voltages generated at A2 and A3 obtained when a signal of 1 GHz is input to the circuit of FIG. 1.

FIG. 2 illustrates output voltages of VB and VC obtained when a signal having an RF of 1 GHz is input to an input terminal. The input signal has been changed such that a peak value thereof was initially a pulse signal of 0.5 V, and then, the peak value 0.5 V was incremented by 0.1 V each time. Although a voltage ripple of VC is great, it can be canceled by disposing a filter at a next stage.

Figure 3:
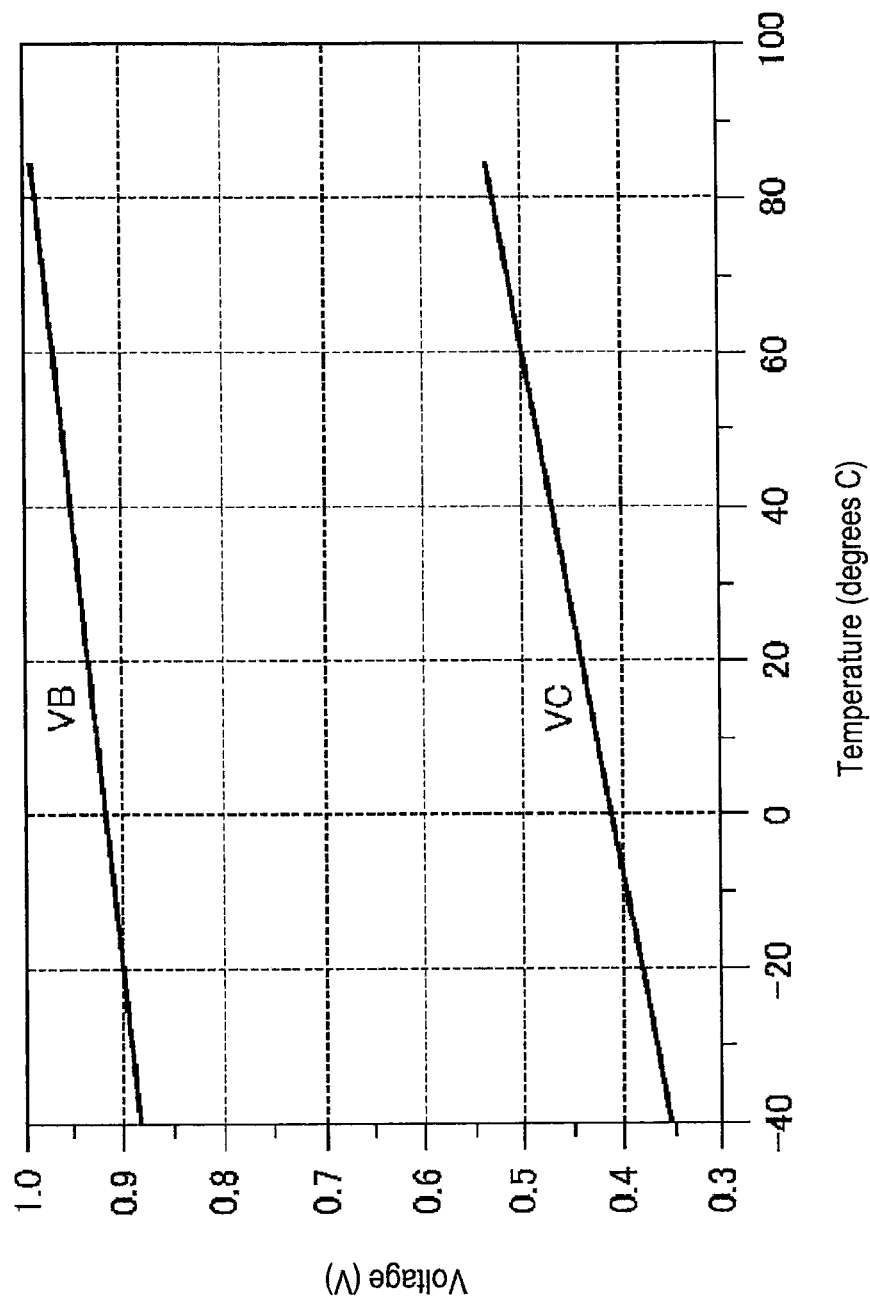
FIG. 3 is a graph illustrating temperature characteristics of voltages at A2 and A3 in FIG. 1.

FIG. 3 illustrates temperature characteristics of the VB and VC voltages in FIG. 2. As shown in FIG. 3, the temperatures of both VB and VC increase, as the respective voltages increase. Here, the voltage values of VB and VC, as detection outputs, are changed by temperature. Thus, a power detection cannot be accurately executed.

Figure 4:
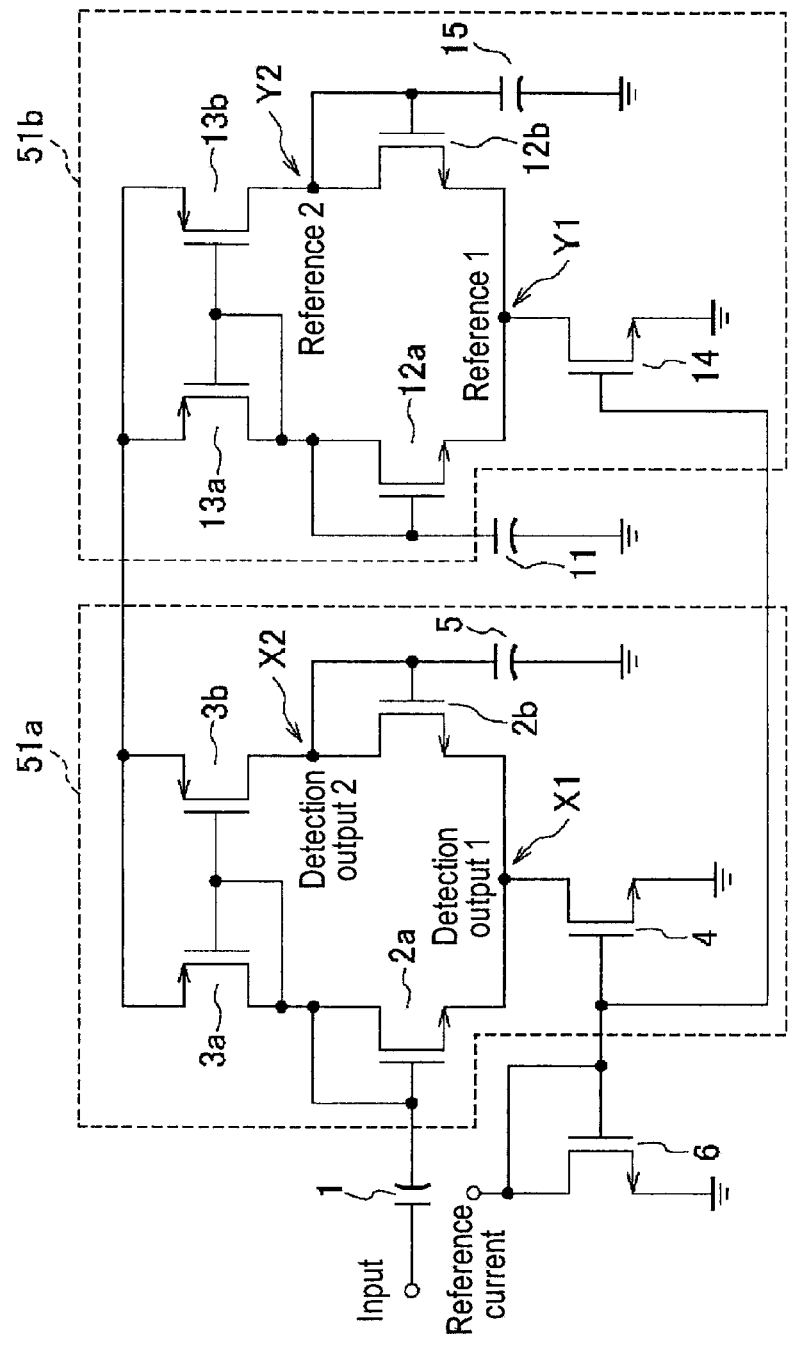
FIG. 4 is a circuitry configured to perform temperature compensation.

Accordingly, the temperature variation is required to be canceled. In FIG. 4, to cancel the temperature variation, two power detection circuits 51a and 51b are used. Reference numerals 51a and 51b are equivalent to the power detection circuit of FIG. 1. The same reference numerals are used for the same elements as those of the power detection circuit of FIG. 1.

The power detection circuit 51a and the power detection circuit 51b are similarly constructed as the power detection circuit of FIG. 1. Nevertheless, the power detection circuit 51b will briefly be described. The power detection circuit 51b includes a capacitor 11 connected to a gate of an N type FET 12a, and the gate and a drain of the FET 12a are short-circuited in order to cancel a DC component. That is, the FET 12a functions as a half-wave rectifier circuit.

Similar to the FET 2a of the power detection circuit 51a, the size and a current value of the FET 12a are set to supply a bias in the vicinity of a threshold value.

A drain of a P type FET 13a and a drain of a P type FET 13b are connected, and a gate of the FET 13a and a gate of the FET 13b are connected. Further, the gates of the FET 13a and the FET 13b are connected to the drain of the FET 12a, and the drains of the FET 13a and the FET 13b are connected to the drains of the FET 3a and the FET3b. A transmission circuit comprises the FET 13a and the FET 13b. Further, a reference output appears at the N type FET 12b through the pair of P type FETs 13a and 13b.

In addition, to cancel out the DC component, the gate and the drain of the FET 12b are short-circuited, and the gate and the drain of the FET 12b are grounded through a capacitor 15. Here, the FET 12b and the capacitor 15 function as a ripple filter.

Meanwhile, an N type FET 6 creates a reference current. The reference current may be generated by applying a predetermined voltage to a drain terminal of the N type FET 6. Here, the FET 4 and FET 14 correspond to constant current sources which allow a predetermined current flow based on the reference current. Both the FET 4 and FET 14 are N type FETs, and the FET 4 corresponds to a constant current source of the power detection circuit 51a and the FET 14 corresponds to a constant current source of the power detection circuit 51b.

As mentioned above, the power detection circuit 51a and the power detection circuit 51b are configured with the same types of transistors, capacitors etc., having the similar circuit characteristics, so they have the similar temperature characteristics in the event of temperature variations. With this configuration, an RF signal is input to an input terminal of the power detection circuit 51a. Meanwhile, a terminal of the capacitor 11 of the power detection circuit 51b is grounded, so that an input signal to the power detection circuit 51b is 0. In other words, only a variation component of a signal due to a temperature change appears in the references 1 and 2 of the power detection circuit 51b.

Thus, a signal variation due to the temperature change can be canceled with a high precision by calculating a difference between a detection output 1 of the power detection circuit 51a and the reference 1 of the power detection circuit 51b.

In addition, a signal variation due to the temperature change can be canceled with a high precision even by calculating a difference between a detection output 2 of the power detection circuit 51a and the reference 2 of the power detection circuit 51b.

According to the foregoing configuration, a temperature compensation can be executed mainly through a combination of transistors (e.g., MOSFETs) without using a combination of any other elements. Further, only the power sources (e.g., constant current sources) having a single polarity may be provided without the necessity of positive and negative power sources. Thus, since the power detection device can be manufactured with a general CMOS process and configured with only the power sources having a single polarity, particularly a low-priced power detection device can be obtained when a semiconductor is integrated.

Figure 5:
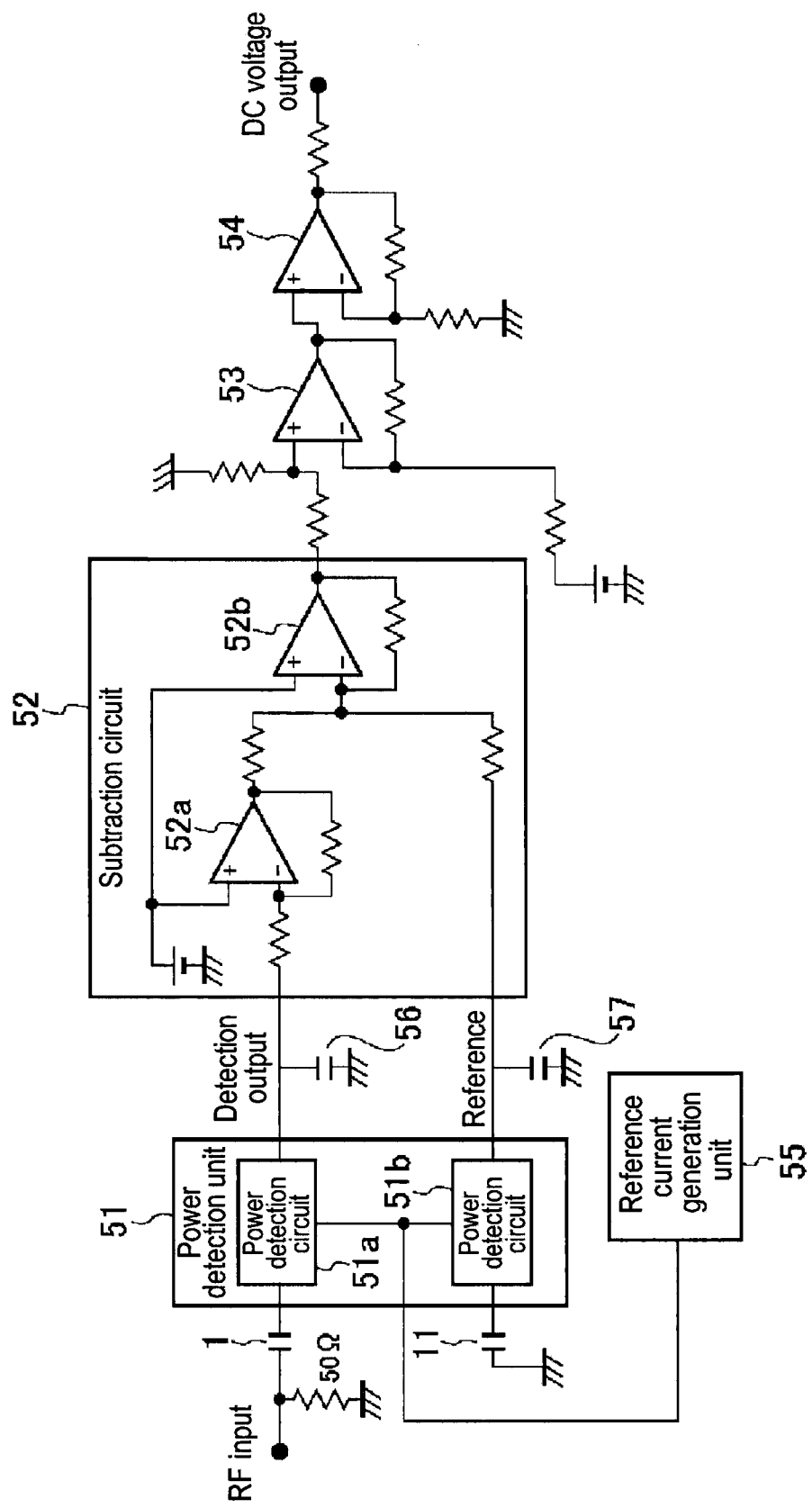
FIG. 5 is a circuitry illustrating an overall configuration of a power detection device using a power detector according to an embodiment of the present disclosure.

FIG. 5 illustrates a configuration of a power detection device using the power detection circuits of FIG. 4. First, an RF input terminal is a high frequency input terminal. In order to realize a broadband power matching, one terminal of a resistor of 50 Ω is disposed between the RF input terminal and a capacitor 1, and the other terminal of the resistor of 50 Ω is connected to a ground line.

A power detection unit 51 includes the power detection circuit 51a and the power detection circuit 51b described above with reference to FIG. 4. In addition, circuit elements using the same reference numerals as those of FIG. 4 denote the same circuit elements. An RF signal of an input signal is added to a detection output from the power detection circuit 51a. In the power detection circuit, since a DC voltage output is required to be eventually obtained, a capacitor 56 performing as an RF component cancelation filter is installed between a signal line and a GND, and the signal line is connected between the power detection circuit 51a and a subtraction circuit 52. Similarly, a capacitor 57 as the RF component cancelation filter may be installed between a reference signal line and a GND, and the reference signal line is connected between the power detection circuit 51b and the subtraction circuit 52.

Further, a reference current generation unit 55 corresponds to the FET 6 in FIG. 4, and includes a circuit, e.g., a voltage regulator circuit for supplying a reference voltage to the drain of the FET 6.

In addition, the subtraction circuit 52 calculates a difference between a detection output signal from the detection output 1 or the detection output 2 and a reference signal output from the reference 1 or the reference 2. The detection output signal input to a minus terminal of an operational amplifier 52a is invert-amplified by the operational amplifier 52a to become a signal having a polarity opposite to that of the reference signal. Meanwhile, an amplification factor of the operational amplifier 52a is determined as 1 by appropriately setting a value of a resistor connected to the operational amplifier 52a.

Next, both the detection output signal and the reference signal having the mutually opposite polarity are provided to the minus terminal of the operational amplifier 52b, whereas a signal variation due to a temperature change has almost the same size and a mutually opposite polarity as those of the detection output signal and the reference signal. Therefore, the signal variation is canceled. In this manner, the DC voltage, from which the signal variation due to the temperature change was canceled, is invert-amplified by the operational amplifier 52b in order to be output. The output from the subtraction circuit 52 is amplified by an operational amplifier 53 and a load from the operational amplifier 53 is driven by a buffer amplifier 54. Then, a DC voltage output of the output from the buffer amplifier 54 is detected.

Figure 6:
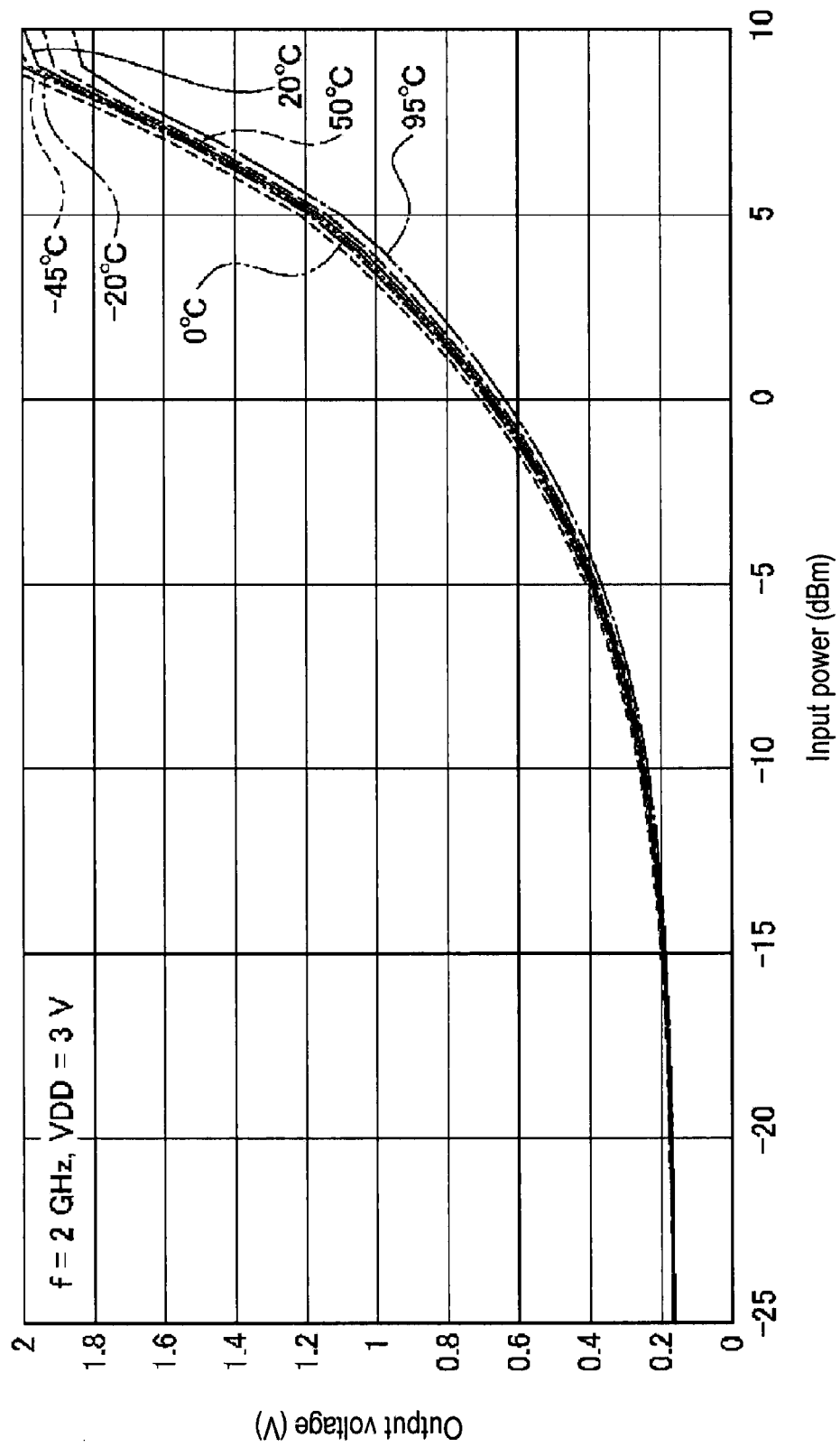
FIG. 6 is a graph illustrating temperature characteristics of an input and an output in the device of FIG. 5.

FIG. 6 shows the results of temperature dependency of the DC voltage output by the power detection device having the configuration as shown in FIG. 5 according to an embodiment of the present disclosure. An RF signal of 2 GHz was input as an RF input, and the amplitude of the RF signal was 3 V. Further, relationships between input power of the RF signal and the DC voltage output were obtained when environmental temperatures were changed into −45 degrees C., −20 degrees C., 0 degrees C., 20 degrees C., 50 degrees C., and 95 degrees C. In FIG. 6, the horizontal axis denotes input power (dBm) and the vertical axis denotes a DC output voltage (V).

As shown in FIG. 6, when the temperatures were changed into −45 degrees C., −20 degrees C., 0 degrees C., 20 degrees C., 50 degrees C., and 95 degrees C., there is no change in the output voltage due to a temperature difference when input of an RF signal is small. Also, even when the input power is large, there is slight change in the output voltage due to a temperature difference. In this manner, it is noted that the power detection device according to an embodiment of the present disclosure exhibits excellent temperature compensation.

The power detection device according to an embodiment of the present disclosure can be applied to devices, such as a mobile terminal, a wireless LAN, a subscriber radio device, radar etc., which detect and controls transmission output power.

According to an embodiment of the present disclosure, the first power detection circuit includes the RF input terminal to which an RF signal is input, the half-wave rectifier circuit, the ripple filter, the transmission circuit, and the constant current sources. Further, the first power detection circuit is mainly assembled with transistors. In addition, the second power detection circuit has the similar circuit configuration as the first power detection circuit, except that the RF input terminal of the second power detection circuit is grounded. In other words, both first and second power detection circuits have the similar circuit characteristics where input signals are different. Thus, a variation of the signal due to a temperature change can be precisely canceled by calculating a difference between the first power detection circuit and the second power detection circuit at the subtraction circuit. In addition, since the positive and negative power sources as those in the related art are not required, the first and second power detection circuits can be manufactured at low cost.

While certain embodiments have been described, these embodiments have been presented by way of example only, and are not intended to limit the scope of the disclosures. Indeed, the novel, systems, methods, devices and apparatuses described herein may be embodied in a variety of other forms or may be combined; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A power detection device, comprising:
first and second power detection circuits configured to output first and second detection signals, respectively, each of the first and second power detection circuits including:
a half-wave rectifier circuit having a transistor, and connected to an RF input terminal;
a ripple filter having a transistor and a capacitor, and configured to filter a rectified signal from the half-wave rectifier circuit;
a transmission circuit having a pair of transistors, and connected to the half-wave rectifier circuit and the ripple filter, the transmission circuit configured to transfer the rectified signal to the ripple filter; and
a constant current source having a transistor to supply a current to the half-wave rectifier circuit, the ripple filter, and the transmission circuit,
wherein an input signal is input to the RF input terminal of the first power detection circuit, and an RF input terminal of the second power detection circuit is grounded; and
a subtraction circuit configured to receive the first and second detection signals and to calculate a difference between the first detection signal of the first power detection circuit and the second detection signal of the second power detection circuit, wherein a gate and a drain of the transistor of the half-wave rectifier circuit is shortcircuited and a source of the transistor of the half-wave rectifier circuit is connected to the constant current source.

2. The power detection device of claim 1, wherein the ripple filter of the first power detection circuit is configured to cancel an RF component of a half-wave rectified signal transmitted by the transmission circuit of the first power detection circuit, and the ripple filter of the first power detection circuit is installed between the first power detection circuit and the subtraction circuit.

3. The power detection device of claim 1, wherein the ripple filter of the second power detection circuit is configured to cancel an RF component of a half-wave rectified signal transmitted by the transmission circuit of the second power detection circuit, and the second ripple filter of the second power detection circuit is installed between the second power detection circuit and the subtraction circuit.

4. The power detection device of claim 1, wherein the transistors of the first power detection circuit and the second power detection circuit are MOS type transistors.

5. The power detection device of claim 1, further comprising:
an operational amplifier configured to amplify an output from the subtraction circuit; and
a buffer amplifier configured to drive a load of the operational amplifier and to output a DC voltage output.

6. A method of driving a power detection device, comprising:
receiving, by an RF input terminal of a first power detection circuit, an input signal, wherein an RF input terminal of a second power detection circuit is grounded;
determining a first detection output signal from the first power detection circuit and a second detection output signal from the second power detection circuit; and
calculating, via a subtraction circuit, a difference between the determined first and second output signals,
wherein the determining includes rectifying, via a half-wave rectifier circuit, the received signal as a rectified signal,
wherein a gate and a drain of a transistor of the half-wave rectifier circuit is shortcircuited and a source of the transistor of the half-wave rectifier circuit is connected to a constant current source.

7. The method of claim 6, wherein the determining includes:
filtering, via a ripple filter, the rectified signal from the half-wave rectifier circuit;
transmitting, via a transmission circuit, the rectified signal to the ripple filter; and
supplying, via the constant current source, a current to the half-wave rectifier circuit, the ripple filter, and the transmission circuit.

8. The method of claim 7, wherein the ripple filter of the first power detection circuit is configured to cancel an RF component of a half-wave rectified signal transmitted by the transmission circuit of the first power detection circuit, and the ripple filter of the first power detection circuit is installed between the first power detection circuit and the subtraction circuit.

9. The method of claim 6, further comprising:
amplifying, via an operational amplifier, an output from the subtraction circuit; and
driving, via a buffer amplifier, a load of the operational amplifier and outputting a DC voltage output.

10. The method of claim 7, wherein the ripple filter of the second power detection circuit is configured to cancel an RF component of a half-wave rectified signal transmitted by the transmission circuit of the second power detection circuit, and the ripple filter of the first power detection circuit is installed between the second power detection circuit and the subtraction circuit.

11. The method of claim 8, wherein the transistors of the first power detection circuit and the second power detection circuit are MOS type transistors.

* * * * *